United States Patent [19]
Takeuchi et al.

[11] Patent Number: 5,809,626
[45] Date of Patent: Sep. 22, 1998

[54] METHOD FOR PRODUCING MULTI DIAPHRAGM STRUCTURE

[75] Inventors: Yukihisa Takeuchi, Nishikamo-gun; Tsutomu Nanataki, Toyoake; Nobuo Takahashi, Owari, all of Japan

[73] Assignee: NGK Insulators, Ltd., Japan

[21] Appl. No.: 802,283

[22] Filed: Feb. 19, 1997

[30] Foreign Application Priority Data

Feb. 20, 1996 [JP] Japan .................................. 8-031640

[51] Int. Cl.⁶ ................................................ H01L 41/22
[52] U.S. Cl. ......................... 29/25.35; 264/618; 310/364
[58] Field of Search .......................... 29/25.35; 310/364; 264/614, 618, 619

[56] References Cited

U.S. PATENT DOCUMENTS 4,610,741  9/1986  Mase et al. ................................ 156/89
5,636,072  6/1997  Shibata et al. ........................... 359/896

FOREIGN PATENT DOCUMENTS 6-40035  2/1994  Japan .

Primary Examiner—Carl E. Hall
Attorney, Agent, or Firm—Parkhurst & Wendel

[57] ABSTRACT

To a ceramic green sheet for a substrate, in which holes for throughholes were formed, a ceramic connecting paste is printed so that a plurality of non-printed portions corresponding to a disposition pattern of a plurality of inner spaces are formed, and a connecting layer for dividing a space into sections is formed so that the connecting paste is not present in portions where the plurality of inner spaces are formed. Then, a thin ceramic green sheet for a diaphragm plate the thin diaphragm plate, is superposed on the connecting layer to obtain a laminate, and the laminate is fired to obtain a unitary multidiaphragm structure. The method provides a multidiaphragm structure free from exfoliation of a laminated layer caused between laminated green sheets and free from deformation of a diaphragm portion caused by punching or handling.

3 Claims, 4 Drawing Sheets

METHOD FOR PRODUCING MULTI DIAPHRAGM STRUCTURE

BACKGROUND OF THE INVENTION AND RELATED ART

The present invention relates to a method for producing a plate-like multidiaphragm structure, in which a plurality of diaphragm portions are disposed with a predetermined disposition pattern in one plane. Particularly, it relates to a method for advantageously producing a multidiaphragm structure used for producing a multiactuator of a display, or the like, a substrate for a sensor, and a substrate for producing a plurality of products which require at least one diaphragm portion.

A conventional diaphragm structure has a ceramic substrate on one side of which a ceramic thin diaphragm is superposed so as to obtain a unitary laminate. Between the ceramic substrate and the diaphragm is formed at least one inner space independently. A portion of the diaphragm which corresponds with the inner space constitutes a thin diaphragm portion. The inner space is connected with the outside by means of at least one throughhole formed in the ceramic substrate.

The diaphragm structure has conventionally been used as a constituting member, or the like, of various sensors and condensers and has drawn public attention as a constituting member of an actuator in recent years. For example, when such a diaphragm structure is used as a sensor constituting member, the diaphragm structure is constituted so that a diaphragm portion of the diaphragm structure detects, by a suitable detecting means, a bending displacement or vibrations received from a subject to be measured. When such a diaphragm structure is used as a constituting member of an actuator, the diaphragm structure is constituted so that a diaphragm portion of the diaphragm structure is transformed by an adequate working element such as a piezoelectric/electrostrictive element, and a pressure is generated in the inner space formed inside the diaphragm structure.

When such a diaphragm structure is used as a constituting member of a multiactuator of a display or the like, a multisensor, or a multicondenser, etc., and when the diaphragm structure is produced with using a substrate from which a plurality of diaphragm structures can be obtained so as to produce a condenser or a sensor having a single element at a low cost, and a dividing machining is used in a latter process, there is required a multidiaphragm structure in which a plurality of thin diaphragm portions corresponding to inner spaces are disposed in one plane independently from one another. For each of the inner spaces of a multidiaphragm structure there is formed at least one throughhole by which each of the inner spaces is connected with the outside.

Generally, a ceramic diaphragm structure is produced by laminating and unitarily firing a plurality of green sheets. Depending on a way of forming inner spaces, there is known the so called punching-laminating method and a method using an insertion matter to be decomposed and gasified by heating. The aforementioned multidiaphragm structure can be produced according to such known methods.

That is, when the aforementioned multidiaphragm is produced by a punching-laminating method, a ceramic green sheet is provided having throughholes each of which is formed in each of positions for a plurality of inner spaces with a predetermined disposition pattern. On the sheet is superposed a ceramic green sheet having punched window portions each corresponding with each of the inner spaces. Further, a very thin ceramic green sheet is superposed thereon. Then the laminate is fired so as to obtain a unitary laminate. A diaphragm unit has an inner space corresponding to a window portion, a diaphragm portion dividing the inner space from the outside, and a throughhole connecting the inner space with the outside. A plurality of the diaphragm units are formed independently from one another. Thus, a multidiaphragm structure is produced so that the diaphragm units are disposed with a predetermined pattern.

According to a method using an insertion matter to be decomposed and gasified by heating, a film of an insertion material comprising a matter which can be gasified or decomposed by heating is formed in the shape of a plurality of islands by a printing method. Alternatively, a plurality of pieces consisting of the matter obtained by molding a sheet in advance are mounted with a predetermined pattern on a ceramic green sheet, a very thin ceramic green sheet is superposed on the plurality of pieces, and then they are fired to unify. The aforementioned matter disappears in the early stage of the firing step or in a degreasing step which is independently provided. Thus, a plurality of diaphragm units each having an inner space and a diaphragm portion dividing the inner space from the outside are formed with a predetermined pattern.

Incidentally, in any of these methods, to at least one of the two surfaces to be joined of a plurality of ceramic green sheets is previously applied a ceramic paste (ceramic adhesive paste) containing more binders and solvents than the green sheets, being easily flattened by a pressure of lamination, and having an effect of facilitating an unitary connection of the green sheets, thereby facilitating a firing unification of the laminated green sheets.

However, when a multidiaphragm structure is densely provided with diaphragm units to obtain a compact one, various problems are caused by the aforementioned methods.

For example, in the punching-laminating method, when a ratio of an area for diaphragm portions to an area of a substrate of a diaphragm structure is increased, adjacent window portions are required to be closely formed by punching the window portions out of the green sheet. Accordingly, a region between windows becomes narrow (little), and the green sheet is prone to damage during in a punching operation. Further, since the green sheet has a low rigidity after punching, it is deformed by a distortion caused during handling, and a good diaphragm shape cannot be obtained. Further, in producing a large diaphragm structure, a green sheet after punching has a problem of a distortion and deformation. Additionally, a punching die is expensive, it takes many months to produce the punching die, and it is technically difficult to produce the punching die because a numerous number of window portions are punched out.

In the method using an insertion matter to be decomposed and gasified by heating, when a ratio of an area which diaphragm portions occupy in to an area of a substrate in a diaphragm structure is increased, an amount of an insertion material (matter) between the green sheets is inevitably increased, and a connecting area of the green sheet around the insertion material, which supports a pressure of a gas generated by gasification or decomposition of the insertion material, is decreased. Accordingly, it is liable to have an exfoliation of a layer of green sheets. Further, since a thick insertion material is put between green sheets, when a plurality of insertion materials are disposed with a little intervals, placement (unitary connection) of the green sheet in portions between the insertion materials is difficult. Since the insertion material has such a thickness, a surface of a laminate of green sheets in the side where a diaphragm is formed has a shape of a trapezoid in a portion where an insertion material is disposed. Accordingly, a surface of a diaphragm structure obtained after firing has an extreme trapezoid shape. Thus, it has been difficult to realize a flat shape or a domed shape having a gentle curvature on the surface.

The present invention has such a background and aims mainly to provide a method for producing a multidiaphragm structure by a new laminating method which does not use a green sheet having window portions formed by punching, which was used in the conventional punching-laminating method, or an insertion material which has been used in a conventional method using an insertion matter to be disappeared and gasified. The present invention also aims to produce a multidiaphragm structure having a high quality at a low cost, the multidiaphragm structure being free from exfoliation of a laminated layer caused between laminated green sheets and free from deformation of a diaphragm portion caused by punching or handling.

SUMMARY OF THE INVENTION

According to the present invention, there is provided a method for producing a multidiaphragm structure comprising a ceramic substrate; a thin ceramic diaphragm plate superposed on one side of the ceramic substrate; a plurality of inner spaces formed between the ceramic substrate and the diaphragm plate, mutually independently in a predetermined disposing pattern; and at least one throughhole for each of the plurality of inner spaces, being formed in the ceramic substrate so as to connect each inner space to the outside, wherein each of portions of the diaphragm plate corresponding to the plurality of inner spaces independently constitutes a thin diaphragm portion, the method comprising:

preparing a ceramic green sheet for a substrate, which gives the ceramic substrate;

forming holes for the throughholes in the ceramic green sheet for a substrate;

printing a ceramic connecting paste on the ceramic green sheet for a substrate so that a plurality of independent non-printed portions corresponding to a disposition pattern of the plurality of inner spaces are formed;

forming a connecting layer for dividing a space into sections so that the connecting paste is not present in portions where the plurality of inner spaces are formed;

superposing a thin ceramic green sheet for a diaphragm plate, which gives the thin diaphragm plate, so as to obtain a laminate; and firing the laminate to obtain a unitary multidiaphragm structure.

According to the method of the present invention, a ceramic green sheet for a substrate and a ceramic green sheet for a diaphragm are unitarily connected by means of a connecting layer for dividing a space into sections which are non-printed portions and each of which corresponds to each of a plurality of inner space. The connecting layer for dividing a space into sections was formed by printing a ceramic connecting paste on a ceramic green sheet for a substrate. A thus obtained laminate is fired to be unified, thereby forming inner portions of the non-printed portions of the connecting layer for dividing a space into sections. Accordingly, a plurality of inner space is present between a ceramic substrate and a diaphragm plate. Simultaneously, portions of diaphragm plate which correspond to the plurality of inner spaces are independently constituted as a thin diaphragm portion.

Thus, in the present invention, since a plurality of inner spaces are formed in a multidiaphragm structure, it is sufficient to form a predetermined connecting layer for dividing a space into sections by a simple printing using a predetermined ceramic connecting paste. The method of the present invention does not need to place a green sheet having a plurality of window portions each corresponding to each of the inner spaces unlike a conventional method. Also, there is no need to place a plurality of disappearing materials having a predetermined thickness.

According to one of the advantageous modes in a method for producing a multidiaphragm structure following the present invention, the connecting layer for dividing a space into sections formed by a printing of the connecting paste is formed so as to have a thickness of 5–50 µm after firing.

According to another advantageous mode in a method for producing a multidiaphragm structure following the present invention described above, the connecting paste contains a ceramic powder and a solvent, and the connecting layer for dividing a space into sections to be formed by printing the connecting paste is dried so as to have a ratio of 3–10 volume parts of the solvent to 100 volume parts of the ceramic powder prior to superposition of the ceramic green sheet for the diaphragm plate. Thus, a connecting paste constituting a connecting layer for dividing a space into sections is not completely dried. A ceramic green sheet for a substrate and a ceramic green sheet for a diaphragm plate are connected by the connecting paste in which a solvent remains to a certain degree, thereby facilitating a unification of these green sheets more effectively.

DETAILED DESCRIPTION OF THE PREFERRED EMBODIMENT

Figure 1:
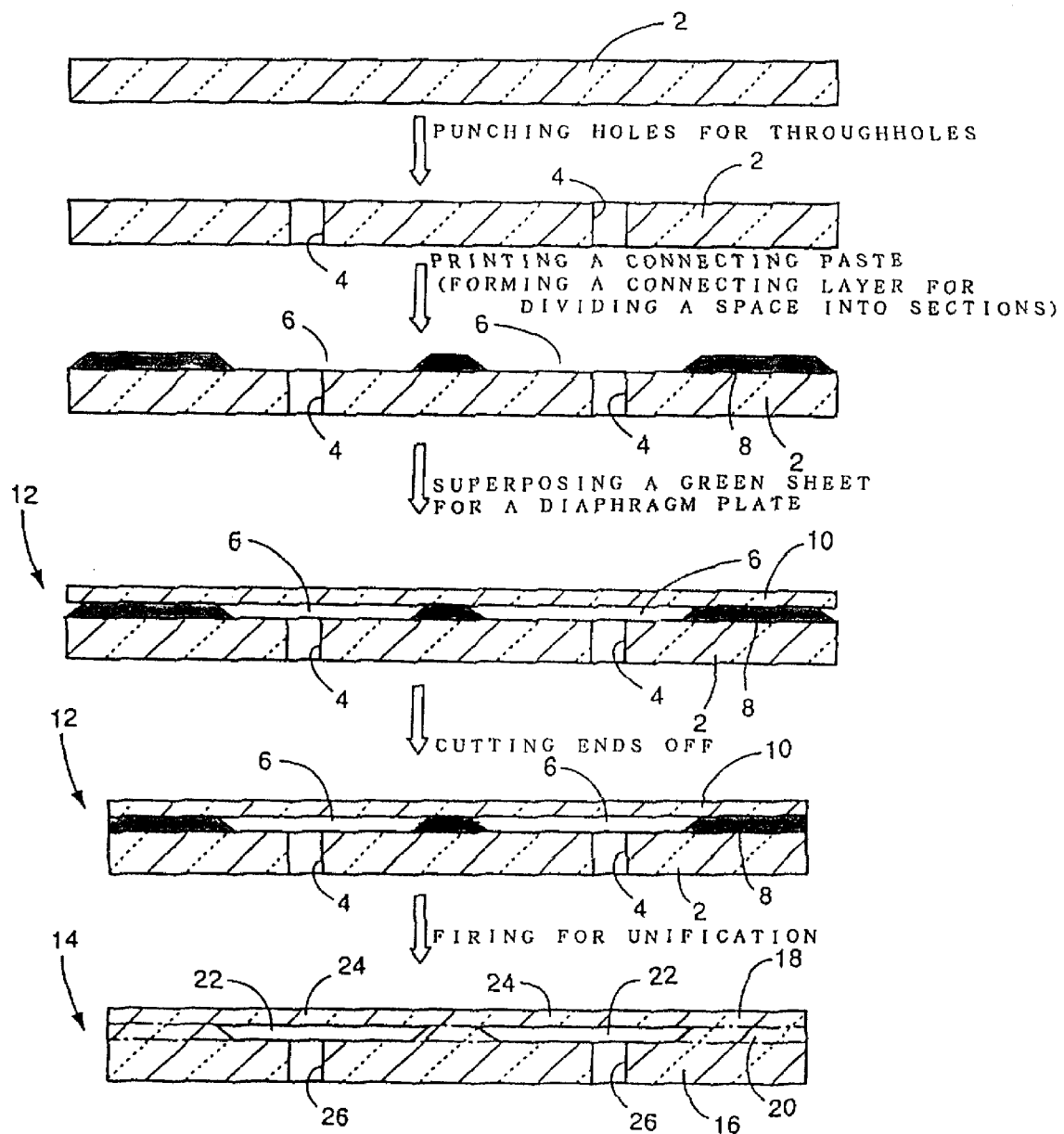
FIG. 1 is an explanatory view of processes showing a typical embodiment showing a method for producing a multidiaphragm structure of the present invention.

In the present invention there is produced a multidiaphragm structure having independent inner spaces corresponding to a plurality of diaphragm portions disposed with a predetermined pattern. In such a production, a predetermined connecting layer for dividing a space into sections is formed by a printing of a ceramic connecting paste between two ceramic green sheets which are layered and unified so as to obtain a laminate. A unitary laminate is obtained by firing the laminate. Thus, there is realized a multidiaphragm structure having a plurality of inner spaces disposed with a predetermined pattern by a presence of sections of a space divided by a connecting layer, in other words, a plurality of independent non-printed portions. FIG. 1 shows a typical example of a method for producing a multidiaphragm structure according to the present invention. Incidentally, the example shows a structure having two inner spaces so as to simplify an explanation.

That is, in processes for producing a multidiaphragm structure as shown in FIG. 1, a ceramic green sheet 2 for a substrate is first prepared, which ultimately provides a ceramic substrate constituting the multidiaphragm structure. The green sheet 2 for a substrate is produced in the same manner as a conventional one. That is, to a predetermined ceramic material are added an adequate binder, a plasticizer, a dispersant, a sintering aid, an organic solvent, or the like, in a manner similar to a conventional one so as to have a slurry or a paste. A sheet having a predetermined thickness is formed in by known manner such as doctor blading, a calendering, printing, reverse roll coater method, or the like, by using such a slurry or a paste. Then, as necessary, the sheet is subjected to cutting, machining, punching, or the like, or a plurality of sheets are layered to have a formed material (a green sheet 2 for a substrate) having a predetermined shape and a predetermined thickness.

Incidentally, a thickness and a size of the green sheet 2 for a substrate 2 are suitably selected according to a desired use of a multidiaphragm structure, and it is therefore difficult to give regulations of a size and a thickness uniformly. For example, the green sheet 2 should have a thickness by which an obtained ceramic substrate can sufficiently exhibit a function as a supporter in a multidiaphragm structure. Generally, a thickness is the one which gives a ceramic substrate a thickness of 50 $\mu$m or more, preferably about 80 $\mu$m–200 $\mu$m.

As a ceramic material used for producing such a green sheet 2 for a substrate can be suitably selected from known various kinds of materials. Generally, there is used mullite, spinel, silicon carbide, silicon nitride, cordierite, aluminum nitride, titania, beryllia, stabilized zirconia, partially stabilized zirconia, alumina, or a mixture thereof. Particularly, stabilized zirconia, partially stabilized zirconia, alumina, or a mixture thereof is desirable. Further, there is particularly preferably used a partially stabilized zirconia as a main component, which consists of mainly tetragonal crystal, or at least two kinds of crystals selected from cubic, tetragonal, and monoclinic crystals produced by adding a compound such as yttrium oxide as the present inventors disclose in U.S. Pat. No. 5,430,344, or the like. Furthermore, besides the aforementioned materials, there can be used a ceramic material such as a glass ceramic, or the like.

To the above-prepared green sheet 2 for a substrate are formed at least one hole 4 for a throughhole for connecting each inner space to outside by means of punching, or the like. Incidentally, for one inner space, one hole 4 for a throughhole is formed here. However, the number and the size of holes 4 are suitably selected as necessary. Accordingly, more than one hole 4 for throughholes may be formed for one inner space.

Then, to the green sheet 2 for a substrate with the holes 4 for throughholes being formed therein, is printed a predetermined ceramic connecting paste so that a plurality of non-printed portions 6 corresponding to a disposition pattern of a plurality of inner spaces in a multidiaphragm structure are independently formed. Thus, there is formed a connecting layer 8 for dividing a space into sections, which has portions (6) where a connecting paste is not present and a plurality of inner spaces are formed. Though the connecting layer 8 for dividing a space into sections is printed after the holes 4 for throughholes are formed here, the order is not limited, and the connecting layer 8 may be formed before the holes 4 for throughholes are formed. However, in the case that the throughholes are formed by using a punching mold, the aforementioned order is preferable so as to avoid corruption of a connecting layer, or the like.

Incidentally, a ceramic connecting paste for printing and forming the connecting layer 8 for dividing a space is similar to a conventional connecting paste for connecting green sheets. To a predetermined ceramic powder material are added a suitable solvent (generally an organic solvent) in a larger amount than a green sheet (2, 10) to be connected. As necessary, a binder, a dispersant, a sintering aid, or the like, is added to the material. Thus obtained connecting paste is printed on the green sheet 2 for a substrate by means of an ordinary printing method so as to form a connecting layer 8 for dividing a space into sections. It is possible to constitute the connecting layer 8 for dividing a space into sections of two layers by printing the connecting paste twice. In this case, the layer printed first is preferably wider than the layer printed secondly lest the layer printed secondly should be out of the layer printed first even if a shear in printing is caused upon second printing. In the two printing operations, a volume of a binder and a volume of a solvent may be the same or different from each other.

A ceramic powder constituting such a ceramic connecting paste is preferably a powder containing a ceramic material similar to that of the ceramic green sheets (2, 10) to be connected. Further, a thickness of a connecting layer 8 for dividing a space into sections, which is formed by printing such a ceramic paste, is suitable selected so that inner spaces each having a desired size are formed. Generally, the connecting layer 8 is preferably formed so that it has a thickness of 5–50 $\mu$m after firing. When the thickness is less than 5 $\mu$m, a green sheet 2 for a substrate and a green sheet (10) for a diaphragm, which is superposed on the green sheet 2, stick to each other and it is difficult to form effective inner spaces. When the thickness exceeds 50 $\mu$m, it is difficult to maintain precision of a shape, and it causes a problem of a shape variance in inner spaces to be formed.

Further, a shape of each of non-printed portions 6 corresponding to a disposition pattern of inner spaces corresponds to a shape of each of the inner spaces and is formed so as to correspond to a plane figure of each of various kinds of circles, ovals, rectangles, polygons, or the like.

Thus, in a green sheet 2 for a substrate with a connecting layer 8 for dividing a space into sections, at least one of holes 4 for throughholes is placed in each of non-printing portions 6 of the connecting layer 8.

Then, since a connecting paste constituting the connecting layer 8 printed on a green sheet 2 at a predetermined pattern includes a great amount of solvent, the connecting layer 8 is subjected to drying. On the dried connecting layer 8, a predetermined ceramic green sheet 10 for a diaphragm plate is superposed in a manner similar to conventional one so as to form a unitary laminate 12. Incidentally, in order to obtain the unitary laminate 12, a laminate obtained by connecting a green sheet 2 for a substrate and a green sheet 10 for a diaphragm plate is heated and pressed generally at a temperature of 70°–100° C. under a pressure of 10–100 kg/mm$^2$ for about 1–3 minutes.

Incidentally, upon forming the unitary laminate 12, before the green sheet 10 for a diaphragm plate is superposed, the connecting layer 8 formed on the green sheet 2 is not completely dried, but partially dried so that a solvent remains in a ceramic powder in the connecting paste in the ratio of 3–10 parts by volume of the solvent to 100 parts by volume of the ceramic powder. Then, the green sheet 10 for a diaphragm plate is desirably superposed. Such a partially dried connecting layer 8 advantageously facilitates unitary connection of the layered green sheets 2 and 10. Accordingly, there can be obtained a multidiaphragm structure which has a unitary structure obtained by effective firing.

The green sheet 10 for a diaphragm plate can be formed in a similar manner and by using a similar material as in producing a green sheet 2 for a substrate. Particularly, a ceramic material constituting a green sheet 10 for a diaphragm plate is preferably selected from a stabilized zirconia, a partially stabilized zirconia, alumina, or a mixture thereof among the aforementioned materials for a green sheet 2 for a substrate or materials each containing a partially stabilized zirconia as a main component as disclosed in U.S. Pat. No. 5,430,344. In producing an effective unitary multidiaphragm structure of the present invention, a ceramic material constituting a green sheet 2 for a substrate, a ceramic powder constituting a connecting paste (a connecting layer 8 for dividing a space into sections), and a ceramic material constituting a green sheet 10 for a diaphragm plate are the same kind, and particularly the same material (composition of components) is effectively used.

Further, a thickness of the green sheet 10 for a diaphragm plate is suitably selected so as to be a thickness of a diaphragm portion of a thin diaphragm plate in an aimed multidiaphragm structure. Generally, the green sheet 10 desirably has a thickness of 50 $\mu$m or less, preferably about 3–20 $\mu$m after being fired.

Then, thus obtained unitary laminate 12 constituted of the green sheet 2 for a substrate and the green sheet 10 for a diaphragm plate which are unitarily laminated is subjected to working such as cutting an end portion. Then the laminate 12 is subjected to firing in a normal condition for a ceramic material constituting the laminate 12. Thus, a unitary fired body, in other words, a multidiaphragm structure 14 is formed. Accordingly, a temperature for firing the laminate 12 is suitably selected depending on the ceramic material constituting the laminate 12. For example, in the case of zirconia, the firing temperature is generally about 1200°–1700° C., preferably about 1300°–1600° C. In this firing operation, gas generated from the green sheets 2 and 10 and the connecting layer 8 and being present in the non-printing portion 6 is discharged outside through the holes 4 for throughholes lest a useless pressure should be applied to the laminated structure from inside.

A multidiaphragm structure 14 obtained in the aforementioned manner has a unitary structure having a ceramic substrate 16 formed of a green sheet 2 for a substrate and a thin diaphragm plate 18 formed of a green sheet 10 for a diaphragm plate, which are connected by a space dividing layer 20 formed of a connecting layer 8 for dividing a space into sections. A plurality of inner spaces 22 are mutually independently formed between a ceramic substrate 16 and a diaphragm plate 18 in a non-printed portion 6 of a connecting layer 8 for dividing a space into sections. Each portion of the diaphragm plate 18, corresponding to each of inner spaces 22, works as independent diaphragm portions 24. Each of the inner spaces 22 is connected to outside through throughholes 26 given by holes 4 formed in the green sheet 2 for a substrate. The throughhole 26 acts on the corresponding inner spaces 22 and the corresponding diaphragm portions 24.

In sum, the thus obtained multidiaphragm structure 14 has a structure that the ceramic thin diaphragm plate 18 is superposed on one side of the ceramic substrate 16. Between the thin diaphragm plate 18 and the ceramic substrate 16 is formed a space dividing layer 20, thereby forming a plurality of mutually independent inner spaces 22 with a predetermined disposition pattern. Simultaneously, each of portions of a diaphragm plate 18 corresponding to a plurality of inner spaces 22 independently constitutes thin diaphragm portions 24. On the other hand, at least one throughhole 26, which connects each of a plurality of inner spaces 22 to outside, is formed on the ceramic substrate 16.

A disposition pattern of a plurality of inner spaces 22 in the multidiaphragm structure 14 is solely determined by a printing pattern of a connecting layer 8 for dividing a space into sections. Accordingly, shapes of non-printing portion 6 and inner spaces 22 can be optionally selected depending on an optional selection of such a printing pattern. Additionally, the non-printing portions 6 (inner spaces 22) can be made as close as possible as long as the printing of the connecting paste is possible. Accordingly, the inner spaces 22 can be densely and effectively disposed. Since the diaphragm plate 18 is connected to the ceramic substrate 16 by means of the connecting the space dividing layer 20 given by the connecting layer 8, and a gas generated can be discharged outside through the hole 4 (throughhole 26); there is no problem of exfoliation of a laminated layer between the ceramic substrate 16 and the diaphragm plate 18.

[ EXAMPLE ]

The present invention is hereinbelow described in more detail with reference to typical Examples. However, the present invention is by no means limited to the Examples. It should be understood that the present invention can be modified or reformed based on the knowledge of a person skilled in the art, as long as the modification or reform does not deviate from an object of the present invention.

First, a green sheet 2 for a substrate having a thickness of 185 $\mu$m and a green sheet 10 for a diaphragm plate having a thickness of 20 $\mu$m were molded by a conventional method using a partially stabilized zirconia in which 3 mol % of yttria is added. A slurry for the green sheets was prepared by adding totally 60 volume parts of poly(vinyl butyral) resin as a binder and dibutyl phthalate as a plasticizer to 100 volume parts of ceramic material. As necessary, sorbitan fatty acid ester type dispersant was added. Further, 500 volume parts of a mixture of toluene/isopropyl alcohol=50/50 (volume ratio) was added and mixed by a ball mill for 50 hours so as to obtain a slurry. The slurry was then subjected to deairing. Subsequently, a viscosity was adjusted to be 20000 mPa.s. Then, the green sheet 2 for a substrate was formed by a doctor blading method. For forming the green sheet 10 for a diaphragm plate, the slurry was adjusted so as to have a viscosity of 2000 mPa.s. The green sheet 10 for a diaphragm plate was obtained by molding in a reverse roll coater method. To the green sheet 2 for a substrate were formed 36 holes 4 for throughholes each having a shape of a circle having a diameter of 500 $\mu$m with the disposition pattern of 6×6 as shown in FIG. 2, by means of punching using a punching die.

On the other hand, to 100 volume parts of a ceramic material same as in production of the aforementioned green sheets were added totally 60 volume parts of a poly(vinyl butyral) resin as a binder and dibutyl phthalate as a plasticizer, 600 volume parts of acetone as a solvent, and 300 volume parts of 2-ethyl hexanol as a solvent, and they were mixed in a ball mill for 10 hours so as to prepare a slurry for a ceramic connecting paste. Then, the slurry was maintained at 80° C. in a vacuum dryer to remove acetone (including 2-ethyl hexanol as a part) as a solvent, and then subjected to a kneading for 30 minutes with a solvent added as necessary to adjust a viscosity so that a connecting paste having a viscosity of 40000–80000 mPa.s could be obtained.

Figure 2:
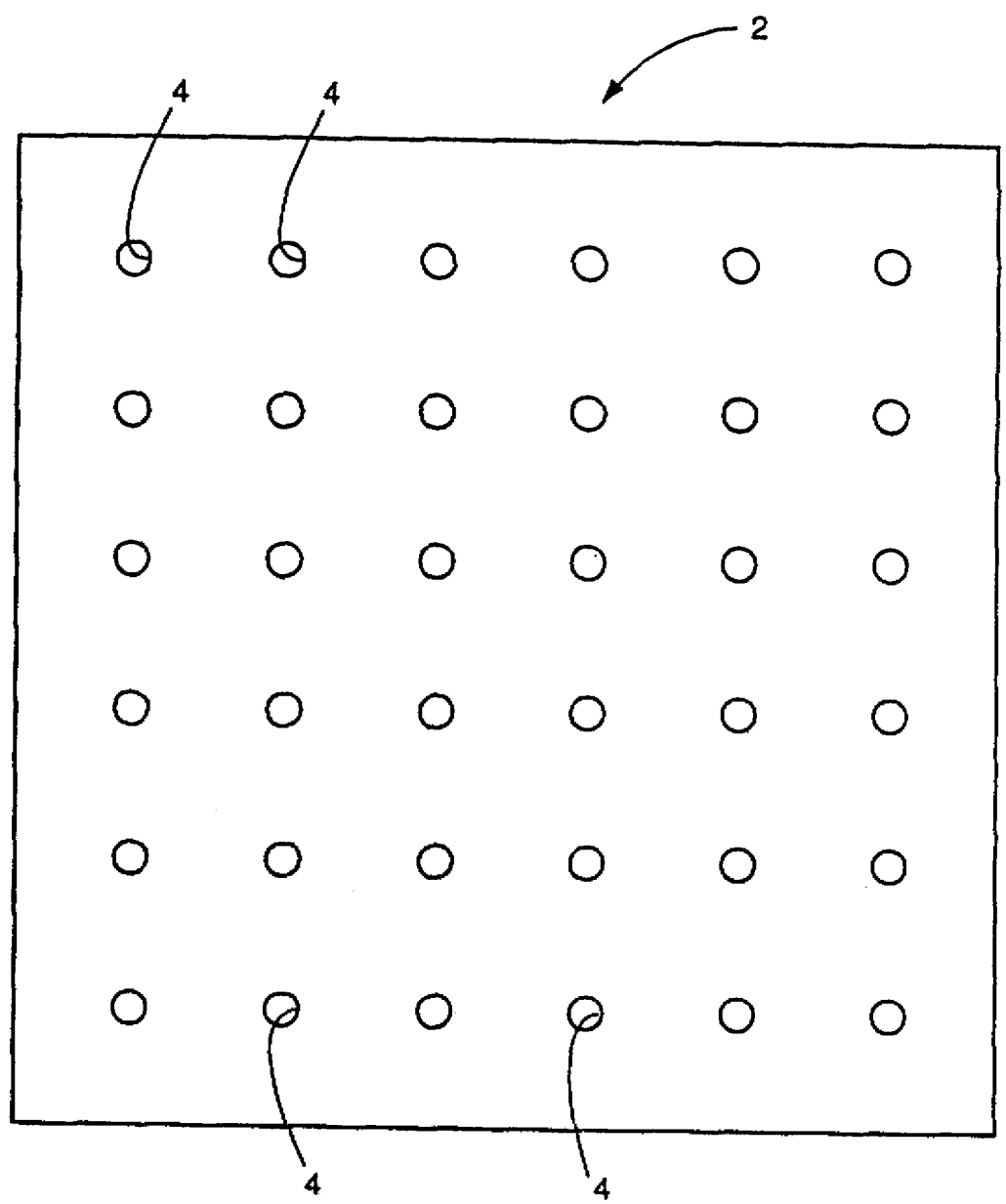
FIG. 2 is a plan explanatory view showing a mode of a green sheet for a substrate having throughholes formed by punching molding in an Example.
Figure 3:
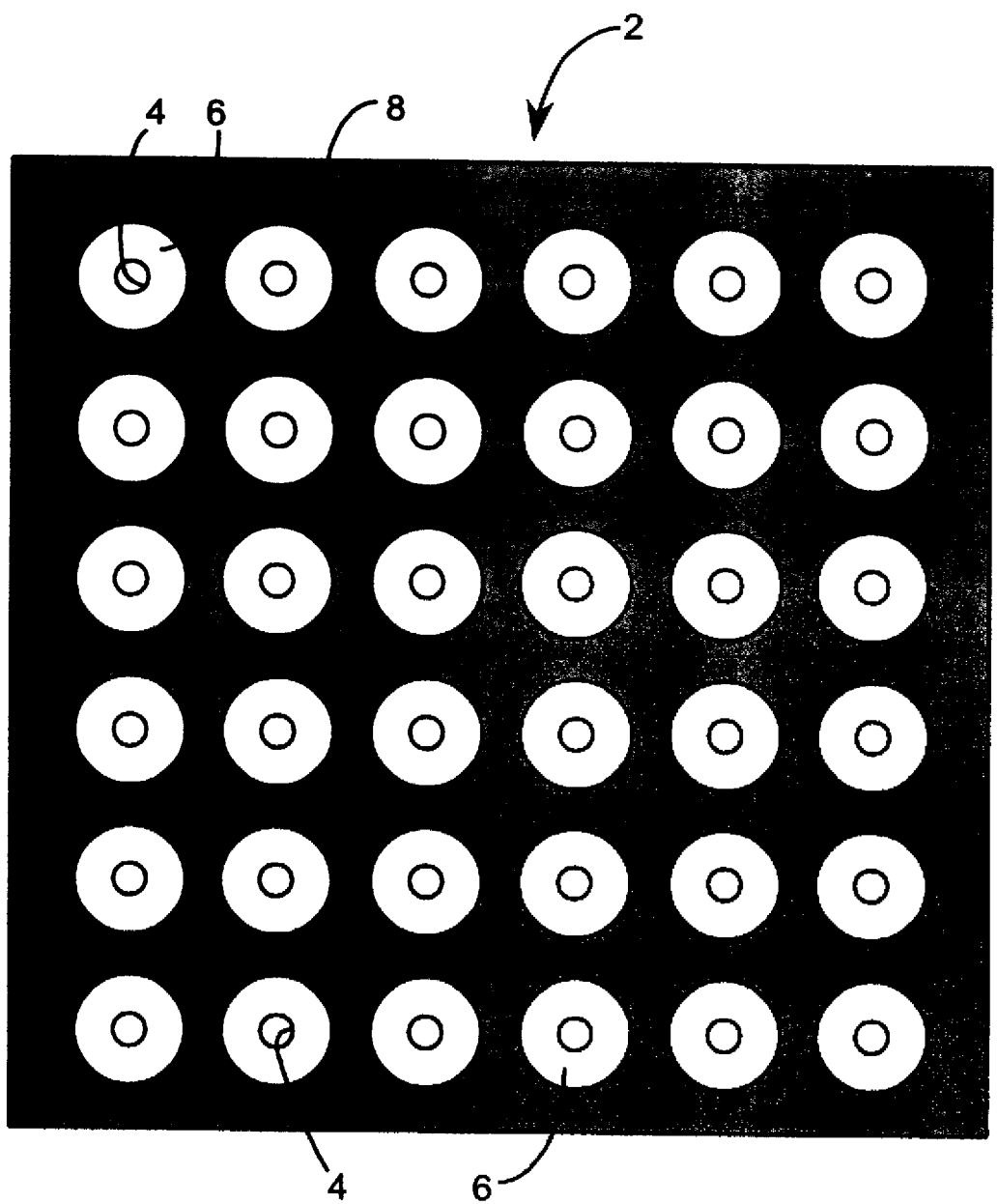
FIG. 3 is a plan explanatory view showing a mode of a green sheet for a substrate having a connecting layer for dividing a space into sections printed thereon in an Example.

As shown in FIG. 3 the obtained connecting paste was printed and applied to the green sheet 2 for a substrate having holes 4 for throughholes formed by punching as shown in FIG. 2 around the holes 4 for throughholes so as to give independent non-printing portions 6 corresponding a disposition pattern of inner spaces. Thus, a connecting layer 8 for dividing a space into sections having a thickness of 30 μm was formed. Incidentally, the 36 non-printing portions 6 present in a connecting layer 8 for dividing a space into sections are disposed with a pitch of 1250 μm, and each of the 36 non-printing portions 6 has a diameter of 1000 μm.

Figure 4:
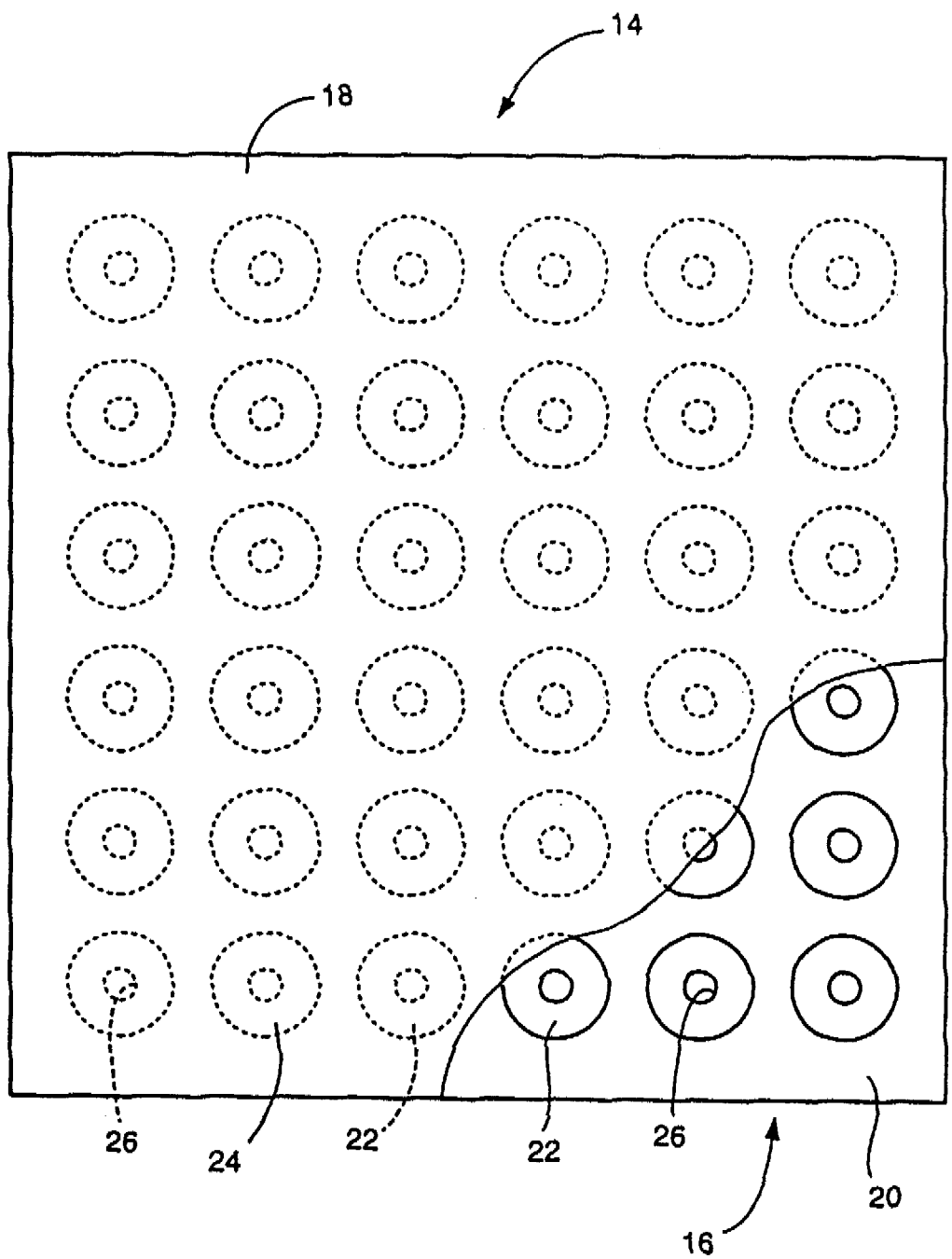
FIG. 4 is a plan explanatory view having a partial cut showing a multidiaphragm structure obtained in an Example.

Then, the green sheet for a substrate with a connecting layer 8 for dividing a space into sections printed and applied thereto with a predetermined pattern was subjected to drying at 80° C. for 15 minutes so that an amount of a solvent contained in the connecting layer 8 was reduced down to a ratio of 1–10 volume parts to 100 volume parts of a ceramic material. Then, the green sheet 10 for a diaphragm plate formed above was superposed on the connecting layer 8, and they were unified at 80° C. under 100 kg/cm$^2$ for one minute so as to obtain a laminate (12). Then, the laminate (12) was fired at 1500° C. for 2 hours to obtain a fired body shown in FIG. 4, i.e., a multidiaphragm structure 14.

Incidentally, since an accurate measurement of an amount of the solvent in the connecting layer 8 is difficult by means of a conventional method, the following method was employed. That is, when a green sheet for a substrate with a connecting layer 8 for dividing a space into sections being printed and applied thereto was heated in a clean oven so as to dry a solvent, the aforementioned connecting layer was printed and applied to a LUMILAR sheet in the same condition so as to obtain a dummy work for measuring a dried amount. The dummy work was dried in the same condition as in the above green sheet for a substrate. A decreased amount by drying was subtracted from an initial content of a solvent in the dummy work so as to calculate an amount of a remained solvent. The numerical value showed an amount of a solvent in a connecting layer 8 of a green sheet for a substrate. When the above value falls below 1 volume part, it is necessary to lower a drying temperature.

A thus obtained multidiaphragm structure 14 has a thickness of a ceramic substrate 16 of 150 μm, a diameter of a throughhole 26 of 400 μm, a thickness of a diaphragm plate 18 of 15 μm, a thickness of a space dividing layer 20 of 15 μm, a diameter of an inner space 22 of 800 μm, and a pitch of an inner space 22 of 1000 μm. A surface of the diaphragm plate 18 is flat as a whole. An extreme trapezoid is not present. The diaphragm plate 18 is firmly connected to the ceramic substrate 16 by means of a space dividing layer 20. A crack detection liquid was put into the space dividing layer 20 through a throughhole 26, and the region being filled with the crack detection liquid was observed by looking through from the side of the diaphragm plate 18. There was no exfoliation of a layer of the laminate, and it was found the multidiaphragm structure 14 has a good quality.

As obvious from the above description, according to the method for producing a multidiaphragm structure of the present invention, a disposition pattern of a plurality of inner spaces formed inside the multidiaphragm structure is easily determined by a printing pattern of a connecting paste. Accordingly, the inner spaces can be densely disposed. Since a green sheet in which window portions are punched is not used unlike a conventional punching-laminating method, a problem of deformation of a diaphragm portion by punching or handling is not caused even upon producing a multidiaphragm structure having a large ratio of areas of diaphragm portions in an area of a ceramic substrate or a multidiaphragm structure having a large area. Further, it does not need a preparation of punching die which costs a lot and takes a few months in production, a number of punching, or a preparation of a green sheet for a window portion. Accordingly, an aimed multidiaphragm structure can be produced at a low cost.

Furthermore, according to the present invention, it is not necessary to put an insertion material between the layers, which was required in a conventional method using an insertion matter to be decomposed and gasified by heating. The method according to the present invention does not need to consider a problem of exfoliation of a layer caused by a pressure of a gas generated by gasification or decomposition. Accordingly, according to the present invention, a multidiaphragm structure having a high quality can be obtained easily and at a low cost. Further, since a shape of a trapezoid originating in an insertion material is not formed on a surface of a diaphragm plate side of the multidiaphragm structure after firing, a flat shape can be advantageously realized.

What is claimed is:

1. A method for producing a multidiaphragm structure comprising a ceramic substrate; a thin ceramic diaphragm plate superposed on one side of said ceramic substrate; a plurality of inner spaces formed between said ceramic substrate and said diaphragm plate, mutually independently in a predetermined pattern; and at least one throughhole for each of said plurality of inner spaces, wherein each of a plurality of portions of said diaphragm plate corresponding to said plurality of inner spaces independently constitutes a thin diaphragm portion, said method comprising:

preparing a ceramic green sheet for a substrate;

forming holes corresponding to said throughholes in said ceramic green sheet;

printing a ceramic connecting paste on said ceramic green sheet so that a plurality of independent non-printed portions corresponding to a pattern of said plurality of inner spaces are formed;

forming a connecting layer for dividing a space into sections so that said connecting paste is not present in portions where said plurality of inner spaces are formed;

superposing a thin ceramic green sheet for a diaphragm plate to obtain a laminate; and firing the laminate to obtain a unitary multidiaphragm structure.

2. A method for producing a multidiaphragm structure according to claim 1, wherein said connecting layer has a thickness of 5–50 μm after firing.

3. A method for producing a multidiaphragm structure according to claim 1, wherein said connecting paste comprises a ceramic powder and a solvent, and said connecting layer is dried so as to have a ratio of 3–10 volume parts of said solvent to 100 volume parts of said ceramic powder prior to superposion of said ceramic green sheet for said diaphragm plate.

* * * * *